United States Patent [19]

Albert

[11] Patent Number: 4,743,790
[45] Date of Patent: May 10, 1988

[54] FORCE SENSING VIBRATING BEAM RESONATOR

[75] Inventor: William C. Albert, Boonton, N.J.

[73] Assignee: Crystal Gage Inc., Franklin Lakes, N.J.

[21] Appl. No.: 38,235

[22] Filed: Apr. 14, 1987

[51] Int. Cl.⁴ .............................................. H01L 41/08
[52] U.S. Cl. ................................... 310/321; 310/323; 310/338
[58] Field of Search ................ 310/321, 323, 330–332, 310/338, 367, 368, 25, 15; 73/777, 778, 781, 141 R, DIG. 1, DIG. 4; 357/26; 338/2, 47

[56] References Cited

U.S. PATENT DOCUMENTS

| 4,321,500 | 3/1982 | Paros et al. | 310/323 X |
| 4,445,065 | 4/1984 | Albert | 310/321 |

OTHER PUBLICATIONS

Prior Art of Single Isolator Beam Resonator by W. C. Albert, Jul. 1978.
Force Sensing Using Quartz Crystal Flexure Resonators, by W. C. Albert, 38th Ann Freq Control Symposium—1984, pp. 233–239.
Technical Report on the Quartz Resonator Digital Accelerometer by N. R. Serra, *Inertial Navigation: Systems and Components Proceedings AGARD Conference*, May 1968, (AGARD CP), pp. 487–516.

*Primary Examiner*—Mark O. Budd
*Attorney, Agent, or Firm*—Brumbaugh, Graves, Donohue & Raymond

[57] ABSTRACT

A vibrating beam resonator is formed with a unitary isolator mass at each end of the vibratory beam. Isolator springs connected to the unitary masses are joined to mounts. Forces applied to the mounts cause the vibrating beam frequency to vary to enable precise force measurements. With this arrangement, fewer cutting operations are required to produce the vibrating beam resonator than were necessary with known resonators. In a preferred embodiment, a side of the vibratory beam is formed by an edge of the crystal blank from which the resonator is cut to further reduce cutting time. This also permits cuts to be made from only one side of the blank.

7 Claims, 1 Drawing Sheet

FORCE SENSING VIBRATING BEAM RESONATOR

BACKGROUND OF THE INVENTION

Force sensing Vibrating beam resonators are used in a number of applications for the precise measurement of force. For example, U.S. Pat. No. 4,445,065 for "Non-Prismal Beam Resonator," invented by the present inventor, describes and illustrates a single vibrating beam resonator used in an accelerometer application for measuring the forces of acceleration or deceleration, such forces being applied to change the frequency of the vibrating beam.

A difficulty encountered with vibrating beam resonators involves the substantial number of cuts that must be made in the material used for the resonator, preferably quartz or some other piezoelectric material. The extensive cutting operations are the result of the prior art configurations of the resonators, which ordinarily include two isolator masses at the ends of and on each side of the vibrating beam. The precision cuts required for such configurations are time-consuming and costly to make. For example, to provide the vibrating beam, isolator masses, isolator springs and mounts used in the resonators shown in the Weisboard U.S. Pat. No. 3,470,400, and Albert U.S. Pat. Nos. 4,445,065 and 4,446,394, numerous precision cuts are needed to form the slots that define the components of the resonator structures. It would be advantageous to decrease the number of required cuts to reduce the time needed to fabricate the resonator structures from quartz or other piezoelectric blanks, hence affording significant cost savings.

SUMMARY OF THE INVENTION

The present invention provides a vibrating beam resonator which, due to its reduced complexity, lends itself to production using fewer cutting operations than were necessary with prior art resonators.

More specifically, the inventive vibrating beam resonators are formed with a unitary isolator mass at each end of the vibrating beam and each mass being positioned at one side of its associated beam end. With this arrangement, the unitary mass has been found to isolate, effectively, the vibrations generated in the beam from mounts to which the isolator masses are joined by isolator springs.

In a preferred embodiment of the invention, one side of the vibrating beam is formed by the edge of a crystal blank from which the resonator is cut. This further reduces the amount of cutting required and, in addition, enables cuts to be made from only one side of the blank.

DESCRIPTION OF EXEMPLARY EMBODIMENTS

Figure 1:
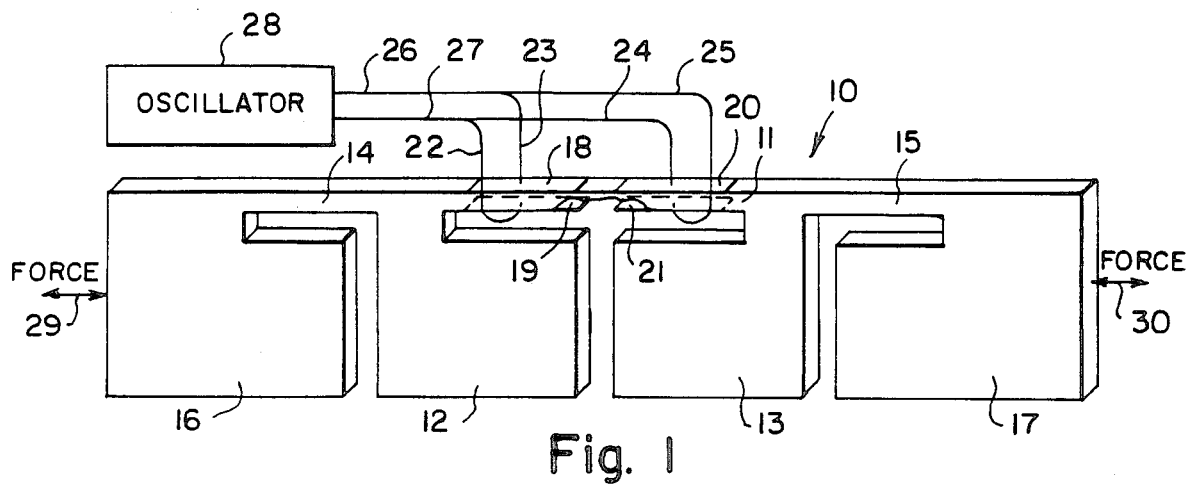
FIG. 1 is a view in perspective showing one embodiment of the inventive vibrating beam resonator.

Referring to the invention in greater detail with particular reference to FIG. 1, a vibrating beam resonator 10 cut from a rectangular quartz crystal blank, or other suitable piezoelectric material blank, includes a vibratory beam 11, unitary isolator masses 12 and 13 at each end and at one side of the vibrating beam, isolator springs 14 and 15 extending from the isolator masses, and mounts 16 and 17 at the ends of the isolator springs. A quartz crystal blank used to form the vibrating beam resonator may, for example, be 0.90 inches long, 0.25 inches wide and 0.02 inches thick.

The several elements of the resonator are defined by cutting suitable slots as shown in the drawings. The blanks are cut through use of any well known process. The slots in the drawings have been exaggerated in size, for purposes of clarity, typical slots being on the order of 0.02 inches in width. It will be understood that material is removed from the crystal blank to form the illustrated slots.

Suitable electrodes 18 and 19 on the top and bottom of the left hand side of the beam and electrodes 20 and 21 on the top and bottom of the right hand side of the beam are connected by suitable leads 22-25 to input leads 26 and 27 of an electronic oscillator 28. To sustain the vibrations of the beam 11, suitable excitation is furnished by the oscillator 28 to the electrodes 18-21, which can be plated on the beam, as well known in the art. This is the excitation method of Norris U.S. Pat. No. 3,479,536. Other excitation electrode arrangements which require electrodes on all four sides of the beam, well known in the art, can also be used.

Arrows 29 and 30 at the ends of the mounts 16 and 17 indicate forces in both tension and compression that may be applied axially to the beam 11 to vary its frequency of vibrations, thereby to measure the magnitude of such forces.

With the configuration of the vibrating beam resonator shown in FIG. 1, one edge of the quartz blank is used for one side of the vibratory beam 11 and one side of the isolator springs or beams 14 and 15. Thus slots need only be cut to define one side of the vibrating beam and one side of the isolator beams, resulting in a substantial reduction in cutting time. Moreover, since the upper side of the vibrating beam and the isolator beams need not be cut, the accuracy of those edges will be of a higher standard than the accuracy of all but the most precise cuts made in the quartz crystal blank.

The beam 11 is thin and flexible, having a thickness on the order of 0.012 inches. As will be understood, the beam vibrates in a flexure mode known in the prior art for this type of resonator.

The isolator springs are also thin and flexible, on the order of 0.014 inches in thickness, to isolate the vibrating beam and isolator masses from the mounts.

In the prior art it was believed necessary to provide isolator masses on both sides of the vibrating beam as shown, for example, in U.S. Pat. Nos. 4,445,065 and 4,446,394. The present inventive vibrating beam resonator does not require such structure but functions accurately with a unitary isolator mass at each end of the vibrating beam, with each unitary mass being positioned at one side of its associated beam end.

Figure 2:
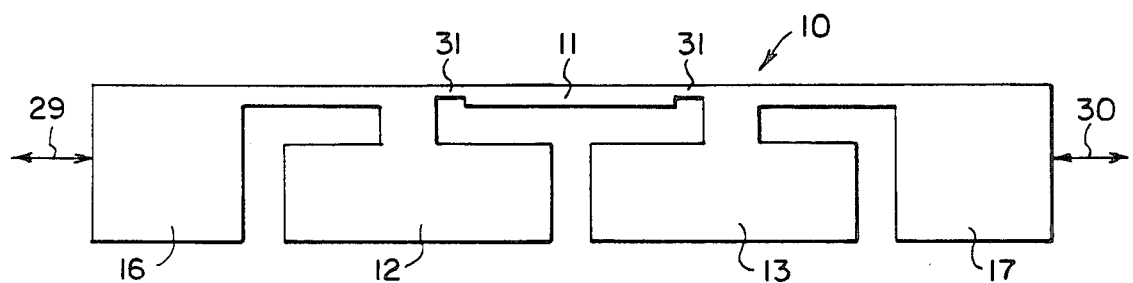
FIG. 2 is a schematic view of another vibrating beam resonator in accordance with the present invention.

FIG. 2 is a further embodiment of the invention having short thinned sections 31 at each end of the vibrating beam to provide a higher sensitivity of frequency change for applied force. Note that the thinned sections are asymmetrical with respect to the axis of the beam 11 so that the beam need only be cut on one side, as explained in discussing the embodiment of FIG. 1. The FIG. 2 embodiment also includes unitary isolator masses 12 and 13 extending in both directions from the ends of the vibrating beam, and on one side of the beam, to enhance the isolation effects.

Figure 3:
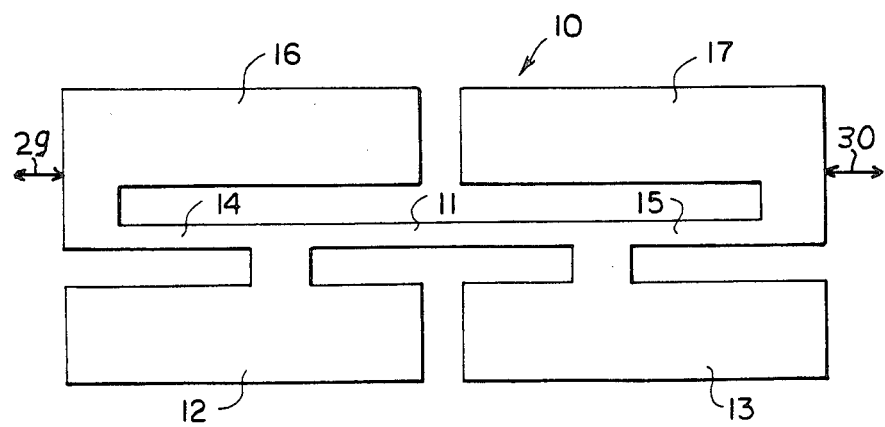
FIG. 3 is a schematic view of still another embodiment of the vibrating beam resonator of the invention.

Referring to FIG. 3, the unitary isolator masses 12 and 13 are located on one side of the beam 11 while the mounts 16 and 17 are located on its other side and positioned there by the isolator springs 14 and 15. The isolator masses extend in both directions from their point of attachment to the isolator beam. This configuration provides advantageous mounting arrangements in certain applications. Thus reduced separation of the mounts or mounting pads 16 and 17 is advantageous when the resonator is mounted to a material or structure having a thermal expansion coefficient different from the quartz crystal resonator material, or other material. In other words, this configuration provides reduced temperature sensitivity.

It may be desirable to locate the isolator mass 13 and mount 16 as shown in FIG. 3, and to interchange the positions of the isolator mass 13 and the mount 17. With such configuration, each mass will remain at the end of and at one side of its associated beam end and the resonator will function the same as described in connection with FIG. 1.

While the material described for use in the vibrating beam resonator is quartz crystal, other suitable piezoelectric materials can also be used. It should also be understood that it is not critical for the unitary isolator masses to be equal in size or mass since the resonator will operate satisfactorily with isolator masses of unequal size or mass. Therefore, it will be understood that various changes and modifications may be made within the scope of the invention which is defined in the appended claims.

I claim:

1. A force sensitive vibrating beam resonator adapted to be formed from a rectangular blank of piezoelectric material comprising a vibratory beam, means for causing the beam to vibrate, a unitary isolator mass at each end of the beam, each unitary mass being positioned at one side of its associated beam end, an isolator spring connected to each of the isolator masses, and a mount at the end of each isolator spring.

2. A force sensitive vibrating beam resonator as defined in claim 1, wherein one side of the vibrating beam is formed by an edge of the blank.

3. A vibrating beam resonator as defined in claim 1, in which one side of the vibrating beam and one side of each of the isolator springs are formed by an edge of the blank.

4. A vibrating beam resonator as defined in claims 1, 2 or 3, wherein the ends of the vibrating beam are thinned to increase the sensitivity of the resonator to applied forces.

5. A vibrating beam resonator as defined in claims 1, 2 or 3, wherein the isolator masses are juxtaposed on one side of the vibrating beam.

6. A vibrating beam resonator as defined in claim 1, wherein the mounts are juxtaposed on one side of the vibrating beam and the isolator masses are juxtaposed on the other side of the beam.

7. A vibrating beam resonator as defined in claim 1, wherein one isolator mass and one mount are juxtaposed on one side of the beam, and the other isolator mass and the other mount are juxtaposed on the other side of the beam.

* * * * *